United States Patent [19]

Howard, Jr.

[11] Patent Number: 4,646,958

[45] Date of Patent: Mar. 3, 1987

[54] FLUXLESS SOLDERING PROCESS USING A SILANE ATMOSPHERE

[75] Inventor: Robert T. Howard, Jr., Essex Junction, Vt.

[73] Assignee: International Business Machines Corp., N.Y.

[21] Appl. No.: 793,404

[22] Filed: Oct. 31, 1985

[51] Int. Cl.⁴ .................... B23K 1/20; H01L 21/98
[52] U.S. Cl. .................................. 228/123; 228/220
[58] Field of Search ............... 228/123, 122, 121, 220

[56] References Cited

U.S. PATENT DOCUMENTS

| | | | |
|---|---|---|---|
| 3,012,903 | 12/1961 | Cape | 228/220 X |
| 3,665,590 | 5/1972 | Percival | 228/220 X |
| 3,754,698 | 8/1973 | Bochinski et al. | 228/220 X |
| 4,576,659 | 3/1986 | Lewis et al. | 228/123 X |

*Primary Examiner*—Kenneth J. Ramsey
*Attorney, Agent, or Firm*—Sughrue, Mion, Zinn, Macpeak & Seas

[57] ABSTRACT

Solder reflow or solder chip joining can be accomplished in a fluxless system by conducting the solder reflow or chip joining procedure in a carrier gas which comprises from about 0.1 to about 10% by volume $SiH_4$, based on the volume of carrier gas and $SiH_4$. A preferred carrier gas for the reflow is hydrogen and a preferred carrier gas for the chip joining is nitrogen.

13 Claims, No Drawings

FLUXLESS SOLDERING PROCESS USING A SILANE ATMOSPHERE

BACKGROUND OF THE INVENTION

1. Field of the Invention

The present invention relates to a fluxless soldering process using a silane-containing atmosphere.

2. Description of the Prior Art

U.S. Pat. No. 3,133,348 Cape discloses a method of welding or brazing where an inert gas such as argon is passed through liquid carbon tetrachloride to convert the liquid tetrachloride into a gas which is directed at a welding area in order to protect the welding operation against the action of air and to remove oxides from the surfaces being welded.

U.S. Pat. No. 3,665,590 Percival discloses a semiconductor flip-chip soldering method. A hot reducing gas is passed through a reducing gas guidance device onto surface oxidized solder which is upon the electrodes of the flip-chip to melt the surface oxidized solder and to purify the surface oxidized solder. Simultaneously, the hot reducing gas is also passed onto surface oxidized solder on bonding pads of the flip-chip package to melt and purify the same. Due to the purification of the surface oxidized solder, when the solder on the electrodes and on the bonding pads is brought together, the purified solder easily coalesces together. Illustrative hot reducing gases include hydrogen gas, hot cracked ammonia gas and any other gas which can reduce and melt the surface oxidized solder.

U.S. Pat. No. 3,681,132 Pammer et al discloses a method of producing a protective layer of $SiO_2$ on the surface of a semiconductor wafer. A gas jet of $SiH_4$ and an inert gas is passed over heated semiconductor wafers on a substrate and thickly coats the substrate in the area of the wafers, simultaneously causing oxygen to act on the wafers to provide a homogeneous layer of $SiO_2$ on the wafers. Use of $SiH_4$ in a solder environment is not disclosed. Illustrative inert gases include nitrogen, argon and other noble gases.

U.S. Pat. No. 3,705,457 Tardoskegyi discloses a wave soldering process for relatively flat work pieces such as printed circuit boards. The boards are pretinned and soldered using a technique where molten solder is forced upwardly through a nozzle to form a standing wave of molten solder which is gently curved in a direction parallel to the work travel direction. A flat work piece is moved in the work travel direction with its undersurface in contact with the standing wave and, as its forward end emerges from the wave, it defines, with the surface of the wave, a space. Inert gas under pressure is applied to this space to exclude air from the solder coated undersurface of the work piece to inhibit oxidation.

It is often conventional in the art of manufacturing semiconducting devices to reflow solder prior to actual joining of a semiconductor chip to a ceramic substrate. The purpose of such reflow is to insure that the solder has the desired shape to yield the desired bond.

It is further known that semiconductor chips can be soldered to appropriate contacts on a ceramic substrate using a chip joining technique where soldering (joining) is effected in a carrier or furnace gas without using a flux.

It is further known that soldering techniques as described above can be effected using a flux.

It is finally known that lead-tin solders are the most commonly used solders for joining semiconductor chips to ceramic substrates.

SUMMARY OF THE INVENTION

It has been discovered that a small amount of silane ($SiH_4$) in a conventionally used carrier or furnace gas (or gases) during reflow, soldering or other metallurgical operations, e.g., circuit board assembly, will reduce any oxides formed such as stannic oxide or lead oxide back to tin and lead, respectively.

One major object of the present invention is to provide a fluxless reflow or solder joining process.

Another major object is to provide such a process which will improve the metallurgical structure and properties of solder joints, including, for example, the obtaining of solder joints of reduced porosity.

These and other objects of the present invention will become clearer from the following discussion.

DESCRIPTION OF THE PREFERRED EMBODIMENTS

When a conventional carrier or furnace gas is used, e.g., nitrogen or hydrogen, analysis after solder reflow and chip joining has revealed residual oxides such as stannic oxide ($SnO_2$) on the surface of the solder when tin is present. Further, analysis has also often revealed the presence of lead oxide (PbO) on the surface of the solder when lead is present.

In accordance with the present invention, one is assured a reduction of metal oxides such as stannic oxide and lead oxide to tin and lead, thus allowing oxide-free molten solder to contact, e.g., corresponding tinned solder points on the substrate (which are conventionally present), and assuring high wetability and consequent joining yields approaching 100% due to the strong reducing effect provided on stannic oxide and lead oxide by the presence of the silane in the carrier gas.

One or more carrier or furnace gases (these terms are treated interchangeably herein) as are conventionally used in fluxless reflow or soldering techniques are used in accordance with the present invention.

The nature of the carrier gas is not overly important. Illustrative carrier gases include hydrogen, nitrogen, forming gas ($N_2+3H_2$)), other nitrogen-hydrogen mixtures, noble gases such as argon, helium, etc., halogenated gases for vapor phase joining, etc.

An effective amount of silane is present in the furnace gas during soldering. The amount of silane has not found to be overly important, for example, amounts as low as about 0.01 vol% have been found to be useful. Based on results to date, it appears that on a commercial scale usually at least about 0.1 vol% silane, more typically about 2–10 vol% by silane, in the carrier gas will provide the results of the present invention.

Unless otherwise indicated, all volume percentages herein are based upon the total volume of the carrier (or furnace) gas and the silane.

The silane ($SiH_4$) basically functions as a scavenger for oxides in a conventional soldering operation in accordance with the present invention reducing oxides such as stannic oxide and lead oxide, if the latter is present, to tin and lead and generating $SiO_2$ and $H_2O$ from the reduction, which exist with the carrier gas and unconsumed silane.

The nature of the solder of the present invention is not overly limited. As earlier indicated, however, the most commonly used solders in the electronic industry normally comprise lead and tin. The lead and tin can be used at any conventional proportions. Usually, however, the most popular solders comprise about 0.1 to about 5 wt% tin, based on solder weight (hereafter all wt% are based on solder weight), with about 2 to about 5 wt% tin, being even more commonly used. The balance of the solder is, of course, generally lead. Other metals may be present as is well known in the art. It is specifically contemplated, however, that the system of the present invention will also be operable with other solders where an oxide can be formed during fluxless reflow or soldering.

Other tin-based solders to which the present invention may be applied include high tin solders which comprise over about 50% tin, balance lead or primarily lead such as (1) about 50 to about 55 wt% tin, balance lead, (2) about 60 to about 65 wt% tin, balance lead (sometimes a small amount of silver is added) and (3) about 95 to about 100% tin, optionally containing antimony or silver in an amount of about 1 to about 5%. Solder (2) finds particular application in circuit board assembly.

The temperature of fluxless reflow or soldering in accordance with the present invention is conventional and, as one skilled in the art will appreciate, is basically tailored to the system undergoing reflow or solder.

In accordance with my preferred procedure, however, temperature profiles are now discussed.

As I preferably practice the present invention, it is part of an overall integrated process, namely, an initial solder wafer reflow step followed by a subsequent chip/ceramic substrate solder joining step. Processing is normally in a conventional belt furnace but other devices can be used. While processing is thus normally continuous, there is no reason why one cannot use a batch process, though on an industrial scale this is not attractive.

As is well known in the art, solder contacts are normally formed on a semiconductor wafer by evaporation through a mask. Since the vapor pressure of lead is greater than that of tin, typically evaporation of a tin-lead solder results in a thick layer of lead and a relatively thin layer of tin. It is conventional to reflow the individual areas of solder on the semiconductor wafer to alloy the lead and tin.

This is conveniently done in a belt furnace by heating the semiconductor wafer, carrying the solder at the appropriate points which are to be bonded to a ceramic substrate, to a temperature greater than the melting point of the tin-lead solder, normally to a temperature in the area of about 350° to about 375° C., preferably in a hydrogen atmosphere, though I have used a nitrogen atmosphere. Reflowing the solder reforms the initial "bumps" of solder into a homogeneous lead-tin alloy which, in one especially useful industrial application, will be about 3 to about 5 mils high having a base diameter of about 4 to about 6½ mils.

Each solder point on the reflowed ceramic substrate will eventually be joined to a metallic pattern on a ceramic substrate which is typically formed by evaporation and photolithographic etching in a conventional manner, or by a screening procedure and firing a green sheet of ceramic frit in a conventional manner or is simply a prepurchased pressed green compact.

The "footprint" or metallization pattern on the ceramic substrate will be a mirror image of the solder "bumps" on the semiconductor chip which is to be joined thereto; while the "footprint" is often tinned with an alloy having a composition corresponding to that of the solder "bumps", I believe tinning is optional and the "footprint" could be formed of, e.g., untinned copper.

I have found a hydrogen atmosphere, for example, to be relatively ineffective for fluxless solder water reflow. On the other hand, the addition of a small amount of silane thereto results in a strongly reducing atmosphere for all soldering and other metallurgical operations.

For the wafer reflow step, temperatures along the lines of those later discussed for the chip joining procedure can be used, although usually I prefer to use a maximum temperature of about 360° C. for wafer reflow. Amounts of silane are as earlier discussed.

The presence of the silane during the wafer reflow procedure results in a better shape of the solder for later chip joining and improved surface properties due to the removal of oxides such as stannic oxide and lead oxide, if the latter is present.

Following wafer reflow, the wafer is generally sawed into chips in a form amenable for joining to a ceramic substrate.

For the chip joining step, I generally prefer to use nitrogen as the carrier gas (plant purity degree; equal to or less than about 10 ppm of impurities such as water and oxygen).

In one preferred temperature profile, the temperature should exceed 320° C. for at least about 2 minutes and the peak temperature should be on the order of about 365° to about 375° C.

Another excellent temperature profile that can be used is to ramp to about 320° C. and hold at that temperature for about 3 to about 4 minutes, followed by a short peak, for example, 1 minute, at greater than 350° C., followed by a ramp down to ambient temperature.

The above two temperature profiles are merely illustrative, though preferred, and as will be apparent to one skilled in the art not only can other carrier gases be used but other temperature profiles can be used for the reflow and chip joining procedures.

The rate of flow of the carrier gas plus the silane during the reflow and chip joining procedures is as conventionally used for a carrier gas alone in the art. I prefer to use relatively low proportions of silane due to the somewhat unstable nature of silane; the main reason for using a carrier gas is to exclude oxygen and moisture from the system. Accordingly, so long as a slight overpressure is maintained, flow rate is relatively unimportant, as is pressure.

U.S. Pat. No. 3,303,393 Hymes et al, fully incorporated by reference, including the drawings thereof, discloses a typical bonding procedure for a microminiaturized circuit element where the process of the present invention finds particular application.

U.S. Pat. No. 3,401,055 Langdon et al, fully incorporated by reference, including the drawings thereof, discloses a typical method of vapor depositing solder onto a substrate useful in the present invention.

Having thus generally described the present invention, the following Example is presented of a currently preferred mode of practicing the invention.

EXAMPLE

Processing was conducted in a conventional muffle furnace. The ceramic substrate was selected from those conventionally used in the art, in this instance, 96% $Al_2O_3$, balance conventional additives. Copper pads were formed thereon in a conventional manner and then the substrate was dipped in a molten 5% tin, balance lead, alloy. The wafer was a conventional semiconductor wafer. Solder bumps were formed thereon in a conventional manner by evaporation. The bumps comprised 2-5 wt% tin, balance lead. These particular wafers were reflowed in hydrogen at a temperature over 320° C. (2 minute peak at 360° C.) since they were taken directly off the line. Pressure was just over ambient to insure exclusion of oxygen and moisture. Following reflow, analysis showed the presence of stannic oxide on the surface of the solder. The wafer was then cut into the desired semiconductor chips.

I have also successfully reflowed such wafers in nitrogen containing about 2 vol% silane at a temperature greater than 320° C. with a 2 minute peak at 360° C.; analysis showed substantially complete absence of stannic oxide. Pressure was just slightly over ambient to insure exclusion of oxygen and moisture.

The semiconductor chips were then joined to the ceramic substrate in an atmosphere of nitrogen containing 2 vol% silane. The nitrogen was plant purity and pressure was again just over ambient to insure the exclusion of oxygen and moisture. The semiconductor chips were held in place on the ceramic substrate by a slight amount of sticky propylene glycol which is volatilized during joining. Other conventional means can be used with equal success.

The temperature was 355°-365° C. Using a hold at 355°-365° C. for periods of about 2 minutes to about 15 minutes resulted in a substantially oxide-free surface. With 2 vol% silane, as the time decreased below about 2 minutes at 355°-365° C. I tended to note increasing amounts of oxide as the time decreased, while at times greater than about 15 minutes, same conditions, no better results were achieved. At 355°-365° C., a 3 minute hold with 2 volt% silane gives ideal results.

I believe equivalent results would be obtained upon chip joining with a temperature ramp to 320° C. (hold for 3 to 4 minutes) with a short peak for 1 minute at a temperature greater than about 350° C., followed by a ramp down to ambient.

While there have been described what are at present considered to be the preferred embodiments of this invention, it will be obvious to those skilled in the art that various changes and modifications can be made therein without departing from the invention, and it is, therefore, intended to cover all such changes and modifications as fall within the true spirit and scope of the invention.

What is claimed is:

1. In a process for joining a semiconductor chip to a substrate by soldering in a carrier gas, the improvement which comprises:
    performing the soldering step in the presence of $SiH_4$, thereby reducing any oxide on the solder, resulting in the formation of $H_2O$ and $SiO_2$ which exit with the carrier gas and $SiH_4$.
2. In a process for reflowing solder in a carrier gas, the improvement which comprises:
    performing the reflowing step in the presence of $SiH_4$, thereby reducing any oxide on the solder, resulting in the formation of $H_2O$ and $SiO_2$ which exit with the carrier gas and the $SiH_4$.
3. A process as claimed in claim 1, wherein the carrier gas is nitrogen.
4. A process as claimed in claim 3, wherein there is used from about 0.1 to about 10% $SiH_4$, based on the total volume of carrier gas and $SiH_4$.
5. A process as claimed in claim 4, wherein the solder comprises from about 0.1 to about 5% tin, balance lead, by weight.
6. A process as claimed in claim 4, wherein the solder comprises over 50% tin, balance substantially lead.
7. A process as claimed in claim 2, wherein the carrier gas is hydrogen.
8. A process as claimed in claim 7, wherein there is used from about 0.1 to about 10% $SiH_4$, based on the total volume of carrier gas and $SiH_4$.
9. A process as claimed in claim 8, wherein the solder comprises from about 0.1% to about 5% tin, balance lead, by weight.
10. A process as claimed in claim 8, wherein the solder comprises over 50% tin, balance substantially lead.
11. In a process for joining a semiconductor chip to a substrate which includes a solder reflow step and joining the semiconductor chip to a substrate by soldering, both of these steps being conducted in a carrier gas, the improvement which comprises:
    performing the solder reflow step in the presence of hydrogen containing from about 0.1 to about 10% by volume silane, based on the total volume of hydrogen and silane; and
    joining the semiconductor chip to the substrate in a carrier gas which comprises nitrogen containing from about 0.1 to about 10% by volume $SiH_4$, based on the total volume of nitrogen plus $SiH_4$.
12. A process as claimed in claim 11, wherein the solder comprises from about 0.1 to about 5% tin, balance lead, by weight.
13. A process as claimed in claim 11, wherein the solder comprises over 50% tin, balance substantially lead.

* * * * *